(12) United States Patent
Maul

(10) Patent No.: US 9,746,779 B2
(45) Date of Patent: Aug. 29, 2017

(54) ILLUMINATION OPTICAL UNIT FOR PROJECTION LITHOGRAPHY

(71) Applicant: Carl Zeiss SMT GmbH, Oberkochen (DE)

(72) Inventor: Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 136 days.

(21) Appl. No.: 14/823,120

(22) Filed: Aug. 11, 2015

(65) Prior Publication Data

US 2015/0346604 A1 Dec. 3, 2015

Related U.S. Application Data

(63) Continuation of application No. PCT/EP2014/054042, filed on Mar. 3, 2014.
(Continued)

(30) Foreign Application Priority Data

Mar. 14, 2013 (DE) .................. 10 2013 204 429

(51) Int. Cl.
*G03F 7/20* (2006.01)
*G02B 26/08* (2006.01)
*G02B 19/00* (2006.01)

(52) U.S. Cl.
CPC ......... *G03F 7/702* (2013.01); *G02B 19/0095* (2013.01); *G02B 26/0833* (2013.01);
(Continued)

(58) Field of Classification Search
CPC ............ G02B 19/0095; G02B 26/0833; G02B 3/0062; G02B 27/0905; G02B 27/0983;
(Continued)

(56) References Cited

U.S. PATENT DOCUMENTS

| 6,195,201 B1 | 2/2001 | Koch et al. |
| 2011/0001947 A1 | 1/2011 | Dinger et al. |

(Continued)

FOREIGN PATENT DOCUMENTS

| WO | WO 2009/095052 A1 | 8/2009 |
| WO | WO 2009/100856 A1 | 8/2009 |

(Continued)

OTHER PUBLICATIONS

International Search Report for corresponding PCT Appln No. PCT/EP2014/054045, dated Jul. 7, 2014.
(Continued)

*Primary Examiner* — Michelle M Iacoletti
(74) *Attorney, Agent, or Firm* — Fish & Richardson P.C.

(57) ABSTRACT

An illumination optical unit for projection lithography serves for illuminating an object field, in which an object to be imaged can be arranged, with illumination light. The illumination optical unit has a field facet mirror having a plurality of field facets. Furthermore, the illumination optical unit has a pupil facet mirror having a plurality of pupil facets. The field facets are imaged into the object field by a transfer optical unit. The illumination optical unit additionally has a deflection facet mirror having a plurality of deflection facets, which is arranged in the illumination beam path between the field facet mirror and the pupil facet mirror. This results in an illumination optical unit in which the illumination of the object to be imaged can be configured flexibly and can be adapted well to predefined values.

22 Claims, 7 Drawing Sheets

Related U.S. Application Data

(60) Provisional application No. 61/781,154, filed on Mar. 14, 2013.

(52) U.S. Cl.
CPC ...... *G03F 7/70075* (2013.01); *G03F 7/70116* (2013.01); *G03F 7/70566* (2013.01)

(58) Field of Classification Search
CPC ... G02B 5/09; G03F 7/70075; G03F 7/70116; G03F 7/702; G03F 7/70566; G03F 7/70033; G03F 7/70191; G03F 7/70091; G03F 7/7015
See application file for complete search history.

(56) References Cited

U.S. PATENT DOCUMENTS

| | | |
|---|---|---|
| 2011/0122392 A1 | 5/2011 | Fiolka et al. |
| 2011/0228244 A1* | 9/2011 | Mann ................ G02B 27/0905 355/67 |
| 2012/0188526 A1 | 7/2012 | Oshino et al. |
| 2014/0211187 A1 | 7/2014 | Hauf et al. |

FOREIGN PATENT DOCUMENTS

| | | |
|---|---|---|
| WO | WO 2010/049076 A1 | 5/2010 |
| WO | WO 2013/013947 A2 | 1/2013 |

OTHER PUBLICATIONS

German Office Action, with translation thereof, for corresponding DE Appl No. 10 2013 204 429.1, dated Nov. 15, 2103.

* cited by examiner

ILLUMINATION OPTICAL UNIT FOR PROJECTION LITHOGRAPHY

CROSS-REFERENCE TO RELATED APPLICATIONS

The present application is a continuation of, and claims benefit under 35 USC 120 to, international application PCT/EP2014/054042, filed Mar. 3, 2014, which claims benefit under 35 USC 119 of German Application No. 10 2013 204 429.1, filed Mar. 14, 2013. International application PCT/EP2014/054042 also claims priority under 35 USC 119(e) to U.S. Provisional Application No. 61/781,154, filed Mar. 14, 2013. The contents of international application PCT/EP2014/052405 and German patent application DE 10 2013 204 429.1 are incorporated by reference.

The invention relates to an illumination optical unit for projection lithography for illuminating an object field, in which an object to be imaged can be arranged, with illumination light. Furthermore, the invention relates to an optical system and an illumination system comprising such an illumination optical unit, a projection exposure apparatus comprising such an illumination system, a production method for producing a micro- and/or nanostructured component using such a projection exposure apparatus, and a component produced thereby.

An illumination optical unit of the type mentioned in the introduction is known from WO 2010/049076 A2 and WO 2009/095052 A1. US 2011/0 001 947 A1 and U.S. Pat. No. 6,195,201 B1 each describe illumination optical units for projection lithography for illuminating an object field comprising a field facet mirror and a pupil facet mirror. An illumination optical unit comprising an individual-mirror array is known from WO 2009/100 856 A1.

A problem addressed by the present invention is that of flexibly configuring the illumination of the object to be imaged and making it readily adaptable to predefined values.

This problem is solved according to the invention via an illumination optical unit for projection lithography for illuminating an object field, in which an object to be imaged can be arranged, with illumination light. The illumination optical unit comprises: a field facet mirror having a plurality of field facets; a pupil facet mirror having a plurality of pupil facets, wherein the field facets are imaged into the object field by a transfer optical unit; and a deflection facet mirror having a plurality of deflection facets, which is arranged in the illumination beam path between the field facet mirror and the pupil facet mirror.

It has been recognized according to the invention that a deflection facet mirror arranged between the field facet mirror and the pupil facet mirror yields new degrees of freedom in the design of the object field illumination. By way of example, it is possible to achieve specific target reflection angles at the field facets and/or at the pupil facets. This can be used for the targeted utilization of polarization effects during reflection at the facets. The field facet mirror and/or the deflection facet mirror can be embodied as a multi- or micromirror array and can be embodied, in particular, as a microelectromechanical system (MEMS). Alternatively, the field facet mirror and/or the deflection facet mirror can have macroscopic field facets and/or deflection facets, respectively. In so far as one of the facet mirrors is embodied as a micromirror array, one of the facets in each case can be formed by a group of micro individual mirrors or micromirrors. Such a group of micro-mirrors is also referred to hereinafter as facet individual-mirror group. One such field facet region in each case from a group of the micro individual mirrors of the field facet mirror can illuminate one of the deflection facets. In principle, one of the deflection facets in each case can also be formed by a group of micro individual mirrors. The deflection facets are oriented such that they direct the illumination light from the direction of the respective field facet region, that is to say from the direction of a specific region of the field facet mirror, onto exactly one of the pupil facets. The field facet region is then a field facet composed of a plurality or of a multiplicity of micro individual mirrors. The deflection facets can be embodied as mirrors tiltable between different tilting positions, for example by 2 degrees of freedom. As a result, for example a plurality of field facets and in particular a plurality of groupings of micro individual mirrors of the field facet mirror embodied, if appropriate, as a micromirror array can be assigned to exactly one of the pupil facets via corresponding guiding of the illumination light. The pupil facets of the pupil facet mirror can be arranged in their entirety such that they are reached by the field facets and/or deflection facets with small absolute tilting angle changes. The pupil facets of the pupil facet mirror can be arranged in a hexagonal close packing, can be arranged in a Cartesian arrangement, that is to say in rows and columns, or can also be arranged rotationally symmetrically. The arrangement of the pupil facets can be deformed, for example in order to correct distortion effects. The deflection facet mirror and/or the pupil facet mirror can be an imaging constituent part of the transfer optical unit and can have, for example, concave and/or convex deflection facets and/or pupil facets, respectively. The deflection facets and/or the pupil facets can have elliptically or hyperbolically shaped reflection surfaces. Alternatively, the deflection facets and/or pupil facets can also be configured as pure deflection mirrors. The transfer optical unit can be arranged down-stream of the pupil facet mirror. The field facet mirror can have a few hundred field facets. The pupil facet mirror can have a few thousand pupil facets. The number of deflection facets can be equal to the number of pupil facets. The number of field facets can be equal to the number of pupil facets. The field facets and the micro individual mirrors constructing them, if appropriate, can have, for beam shaping, curved or alternatively plane reflection surfaces. The deflection facets of the deflection facet mirror can have, for beam shaping, curved or alternatively plane reflection surfaces. The number of deflection facets can be at least equal to the number of pupil facets. The number of field facets or the number of micro individual mirrors—forming the field facets—of the field facet mirror can be much greater than the number of deflection facets and can be for example ten times as great or even greater. The illumination optical unit can be configured such that the deflection facet mirror is not imaged onto the pupil facets. The illumination optical unit can be configured such that the field facets are not imaged onto the deflection facets. Correction micromirrors of the field facet mirror and/or of the deflection facet mirror can be used via swinging away for the correction of an intensity distribution and/or for the correction of an illumination angle distribution over the object field or over an image field into which the object field is imaged. Reflection surfaces of the field facets, of the deflection facets and/or of the pupil facets can be configured as aspherical surfaces in order to minimize imaging aberrations of an imaging into the object field. A polarization control of the illumination light can be realized with the illumination optical unit. An illumination and imaging geometry for projection lithography can be brought about in which object structures are imaged with, in particular, linearly polarized illumination light such that diffraction planes predefined by diffraction angles of the illumination light diffracted at the object structure form an angle with a direction of polarization of the illumination light, which angle deviates from a normal to the respective diffraction plane by not more than 45°, by not more than 25°, by not more than 15°, by not more than 10° or even by not more than 5°. This can be used for optimizing the imaging. The field facets of the field facet mirror can deviate from a form of the object field in order to at least partly compensate for imaging effects during the imaging of the field facets into the object field. For this purpose, the field facet mirror can have a plurality of field facet form types, wherein the individual field facet form types differ from one another. The pupil facet mirror can be arranged in the region of a plane into which a light source of the illumination light is imaged. For their part, the field facets and/or the pupil facets can be subdivided into a plurality of individual mirrors. The pupil facet mirror can be a last component guiding the illumination light in the illumination optical unit. The deflection facet mirror and/or the pupil facet mirror and/or the field facet mirror can be embodied as pivotable about a pivoting axis with the aid of at least one pivoting drive. It is thereby possible to achieve the predefinition of a polarization orientation for the object illumination. Alternatively or additionally, it is possible to achieve the predefinition of an imaging orientation during a superimposing imaging of the field facet into the object field. In so far as, in addition to the pivotable deflection facet mirror, the field facet mirror is also embodied as pivotable, an absolute pivoting angle of the field facet mirror can have a magnitude double that of an associated absolute pivoting angle of the deflection facet mirror. The pupil facet mirror can be pivoted jointly with the deflection facet mirror. In the case of a micromirror embodiment of the field facet mirror in which a field facet is in each case formed by a group of micromirrors, instead of a pivoting of the field facet mirror, a respective reorientation of the field facets can take place by the reassignment of a group of micromirrors to a correspondingly reoriented field facet. A pivoting drive for the field facet mirror can then be dispensed with.

The deflection facet mirror can arranged such that angles (α) of incidence of the illumination beam path along illumination channels, each formed by one of the field facets, by one of the deflection facets and by one of the pupil facets, which are aligned for guiding a partial beam of the illumination light, deviate by a maximum of 25° from a Brewster angle of a multilayer reflection coating on the pupil facet. Such angles of incidence make possible the targeted setting of linearly polarized illumination rays. In particular, a tangential illumination of the object field can thereby be achieved in which a direction of polarization of an illumination ray is in each case perpendicular to a plane of incidence of the illumination ray on the object to be illuminated. In particular, all illumination channels can fulfill the angle-of-incidence condition noted above. A deviation of the angles of incidence from the Brewster angle can be a maximum of 20°, can be a maximum of 15°, can be a maximum of 10° or can be a maximum of 5°. A smaller deviation of the angles of incidence on the pupil facets from the Brewster angle is also possible. The illumination light is deflected along the illumination channels between the field facet and pupil facet assigned in each case to the respective illumination channel by at least one of the deflection facets. Field facet within the meaning of the present application is also understood as a totality of micromirrors of the field facet mirror which are imaged jointly into the object field. A pupil facet which together with one of the field facets forms an illumination channel can also be embodied as a totality of individual mirrors, in particular of micro individual mirrors, of the pupil facet mirror.

The deflection facets can be are arranged on a deflection mirror carrier, which is arranged in the shape at least of a partial ring spatially around the pupil facet mirror. Such a deflection mirror carrier of the deflection facet mirror can be embodied as a full ring completely surrounding the pupil facet mirror or alternatively also as a partial ring surrounding the pupil facet mirror in a circumferential region.

The deflection facets can be arranged on a deflection mirror carrier, which is arranged in the shape at least of a partial ring spatially around the pupil facet mirror, wherein the deflection mirror carrier extends by not more than 200° in the circumferential direction around a center of the pupil facet mirror. Such arrangement of the deflection mirror carrier in the manner of a half-ring can open up structural space for an imaging beam path on an opposite side of the pupil facet mirror relative to the deflection mirror carrier. In an alternative partial-ring arrangement of the deflection mirror carrier around the pupil facet mirror, the deflection mirror carrier can also extend around the center of the pupil facet mirror by more than 180° in the circumferential direction, for example by 210°, 240°, 270° or by 300°.

The deflection facets of the deflection facet mirror can each have reflection surfaces, the aspect ratio of which deviates from the value 1 by more than 30%. Such deflection facets can be arranged such that a projection of the deflection facets, that is to say the reflection surface boundary form thereof, in the ray direction of the illumination light has an aspect ratio in the region of the value 1. A packing density of the individual mirrors can be optimized as a result. Alternatively, the projection of the deflection facets in the ray direction of the illumination light can have an aspect ratio that is greater than 1 and in particular is significantly greater than 1, e.g. an aspect ratio of 2, of 3, or else an even greater aspect ratio. Reflection surfaces of the deflection facets whose aspect ratio deviates from the value 1 by at most 30% are also possible.

The pupil facet mirror can have a pupil facet mirror carrier having in sections the shape of a cone envelope. Such an makes it possible to adapt the geometry of the pupil facet mirror to a required reflection geometry. An opening angle of the cone from which the cone envelope section of the pupil facet mirror carrier constitutes a section can be in the region of 90°. An azimuth angle of the cone envelope section can be adapted to a circumferential angle of the deflection facet mirror and can be in the region of 180°.

The pupil facet mirror carrier can have the shape of a double cone envelope section. Such embodiment of the pupil facet mirror can be such that a pupil plane of the illumination optical unit, that is to say a plane whose illumination light intensity distribution predefines an illumination angle distribution of the object field, intersects a vertex of the double cone whose envelope sections describe the shape of the field facet mirror carrier. The double cone arrangement of the pupil facet mirror carrier, in association with an in particular semicircular deflection facet mirror, can be such that, viewed from every circumferential angle of the deflection facet mirror, the pupil facet mirror forms an inclined line. A cone axis of the double cone can pass through a circle center of a partial-circle arrangement of the deflection mirror carrier. An illumination of the pupil facet mirror with a substantially constant angle of incidence on the pupil facets is made possible. This in turn makes possible a configuration of the pupil facet mirror as a polarizer for the illumination light.

The illumination optical unit can include a beam shaping mirror in the illumination beam path between the pupil facet mirror and the object field. Such a beam shaping, that is to say in particular divergence influencing, mirror makes it possible to influence a position of an exit pupil of the illumination optical unit. The beam shaping mirror has a reflection surface that deviates from a plane surface.

An optical system can comprise an illumination optical unit described above and a projection optical unit for imaging the object field into an image field, in which a wafer to be exposed can be arranged. An illumination system can comprise an illumination optical unit described above and an EUV light source. A projection exposure apparatus can include an EUV light source, an illumination optical unit described above, a projection optical unit for imaging the object field into an image field, in which a wafer to be exposed can be arranged. A method for producing structured components can comprise: providing a wafer, to which a layer composed of a light-sensitive material is at least partly applied; providing a reticle having structures to be imaged; providing a such projection exposure apparatus; and projecting at least one part of the reticle onto a region of the layer of the wafer with the aid of the projection exposure apparatus. The method can be used to produce a component. The advantages of such an optical system, of such an illumination system, of such a projection exposure apparatus, of such a production method and of a such component correspond to those which have already been explained above with reference to the illumination optical unit. The EUV light source can generate EUV illumination light in a wavelength range of between 5 nm and 30 nm.

An optical system can comprise an illumination optical unit described above and a projection optical unit for imaging the object field into an image field, in which a wafer (13) to be exposed can be arranged. Such a projection optical unit of an optical system can be embodied in particular such that it effects eight-fold reduction. This limits an angle of incidence of the illumination light on an object configured, in particular, in a reflective fashion. The transfer optical unit of the illumination system, in particular a beam shaping mirror, can be designed such that an exit pupil of the illumination optical unit lies in the illumination beam path more than 5 m upstream of the object field. Alternatively, it is possible to achieve a position of the exit pupil of the illumination optical unit at infinity, that is to say a telecentricity of the illumination optical unit, or a position of the exit pupil in the illumination beam path downstream of the object field, that is to say in the projection beam path of the downstream projection optical unit.

The illumination optical unit of the projection exposure apparatus can be coordinated with the light source such that illumination light which, if appropriate, has already been partially prepolarized by the light source is guided in the illumination optical unit such that linearly polarized illumination rays generated in particular via the illumination optical unit include the greatest possible portions of this prepolarization. This optimizes a used light efficiency of the projection exposure apparatus.

An illumination optical unit described above when used in a projection exposure apparatus produces a projection exposure apparatus with a variant-rich possibility for selection of illumination settings. Homogeneous fillings of selected pupil regions can be achieved. The facet section images can overlap in the object field. However, this is not mandatory. The facet section images can adjoin one another in the object field.

Exemplary embodiments of the invention are explained in greater detail below with reference to the drawing, in which:

FIG. 1 shows highly schematically a projection exposure apparatus for projection lithography comprising an illumination optical unit and comprising a projection optical unit, wherein an illumination and imaging light beam path is reproduced in a meridional section;

FIG. 2 schematically shows a plan view of a pupil facet mirror and of a deflection facet mirror, which is disposed upstream of the pupil facet mirror in an illumination beam path, as parts of an illumination optical unit of the projection exposure apparatus, as seen from viewing direction II in FIG. 1;

FIG. 3 shows, in a schematic illustration similar to FIG. 1, a further embodiment of an illumination optical unit for the projection exposure apparatus, wherein FIG. 3 illustrates an illumination light beam path between an intermediate focus disposed downstream of a light source and an object or illumination field of the illumination optical unit;

Figure 1:
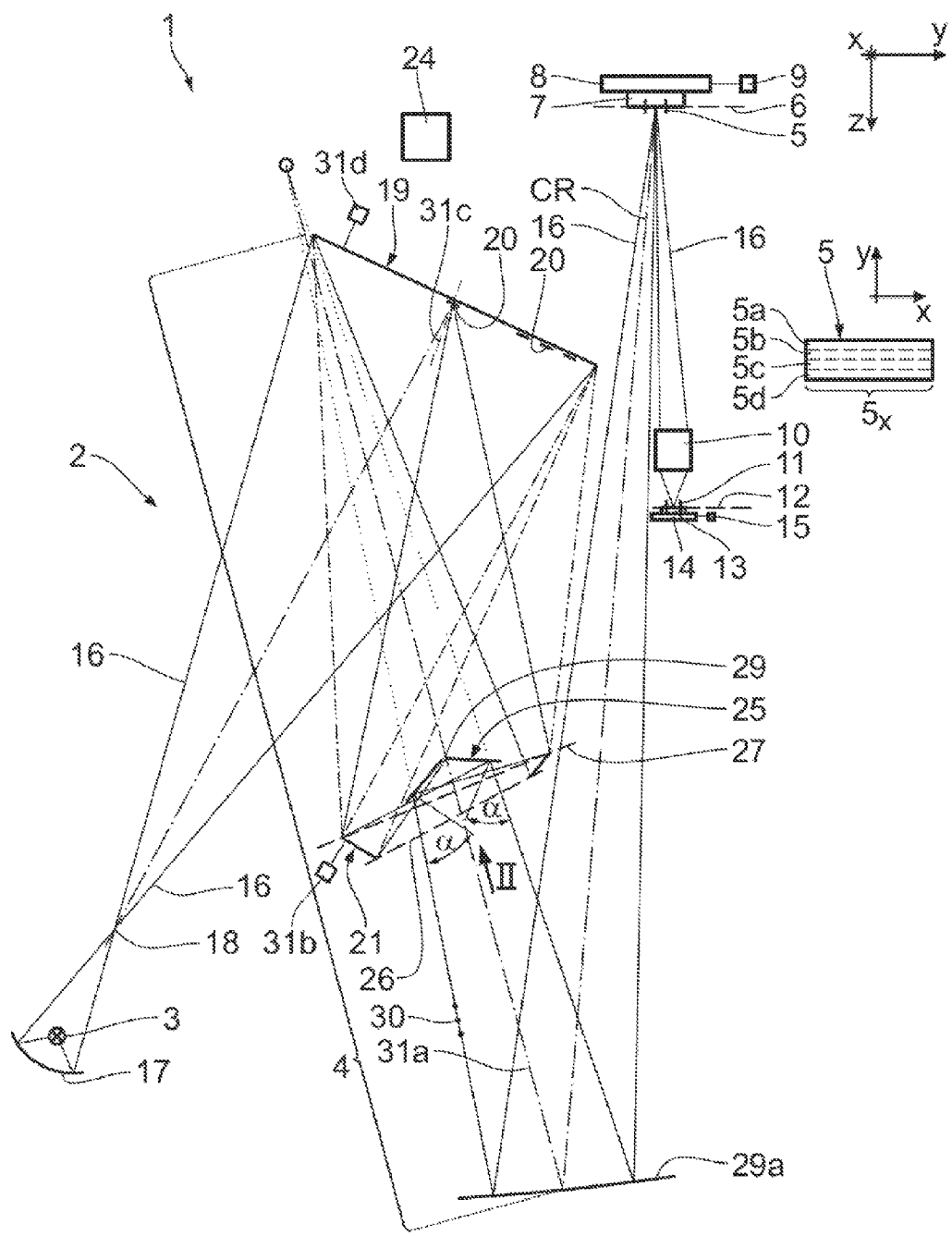
Figure 3:
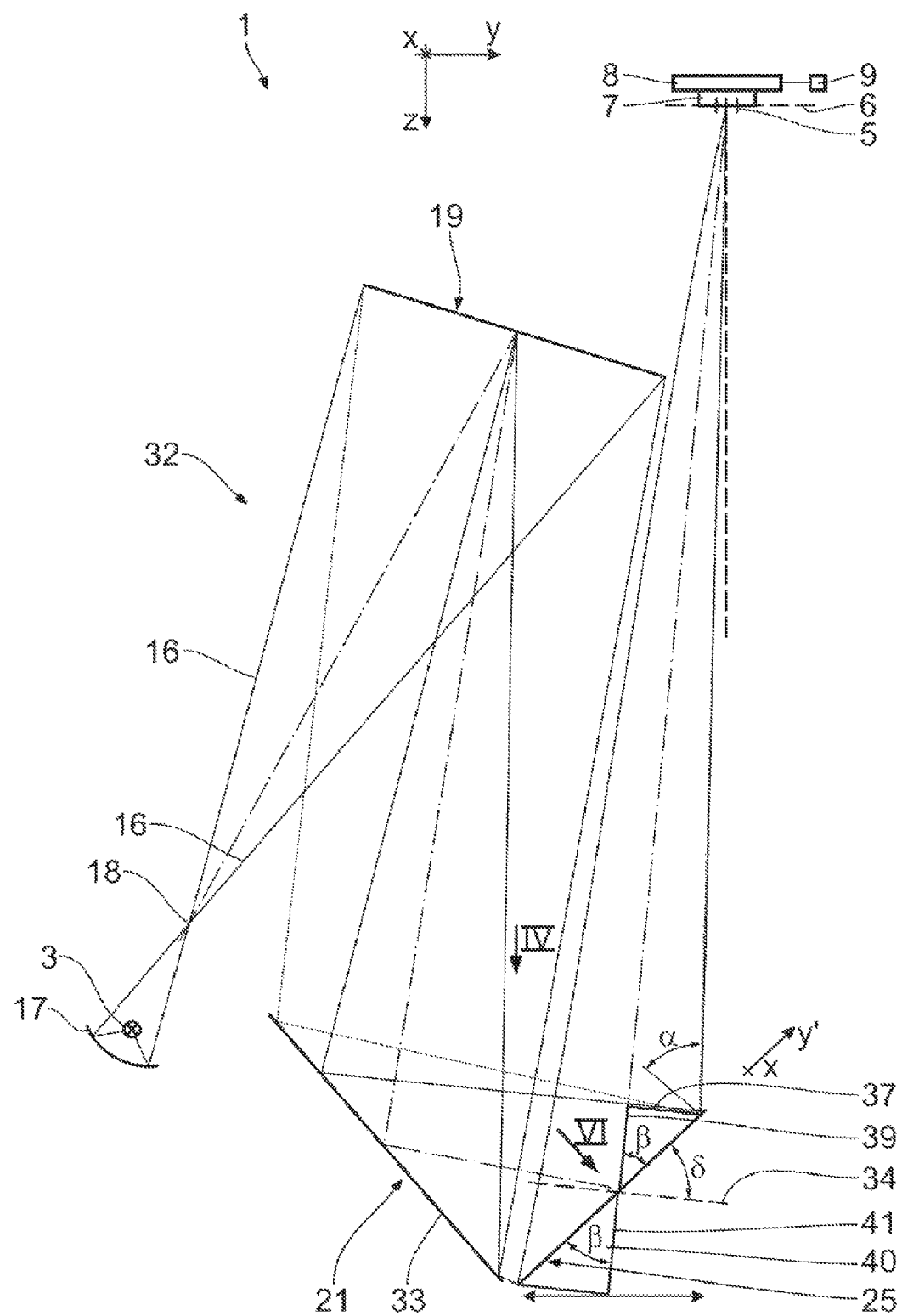
Figure 4:
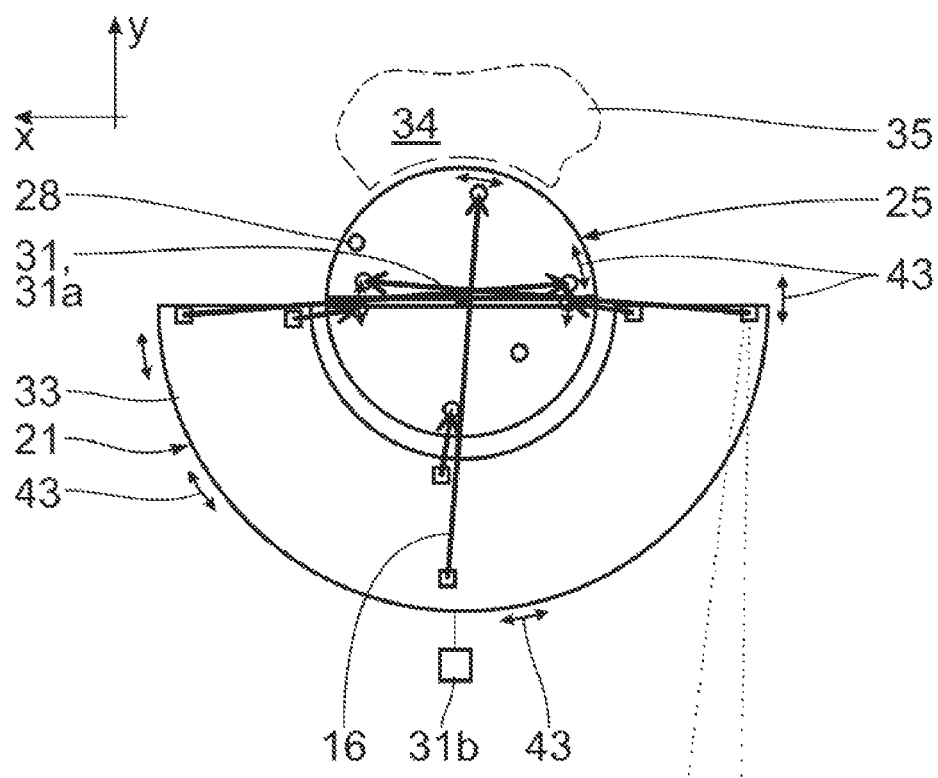
FIG. 4 shows a plan view of a pupil facet mirror and an upstream deflection facet mirror in an illustration similar to FIG. 2, as seen from viewing direction IV in FIG. 3.
Figure 8:
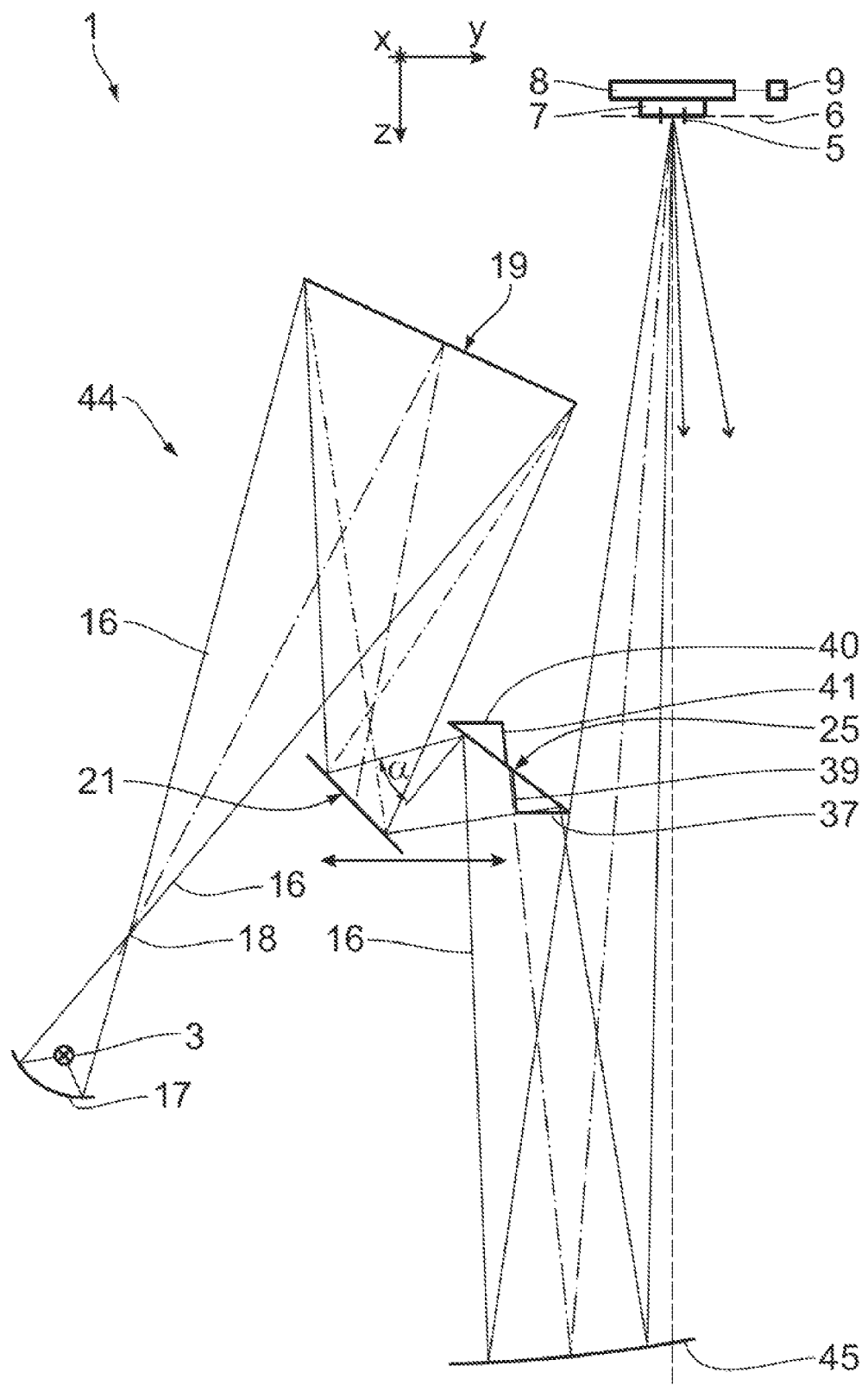
Figure 9:
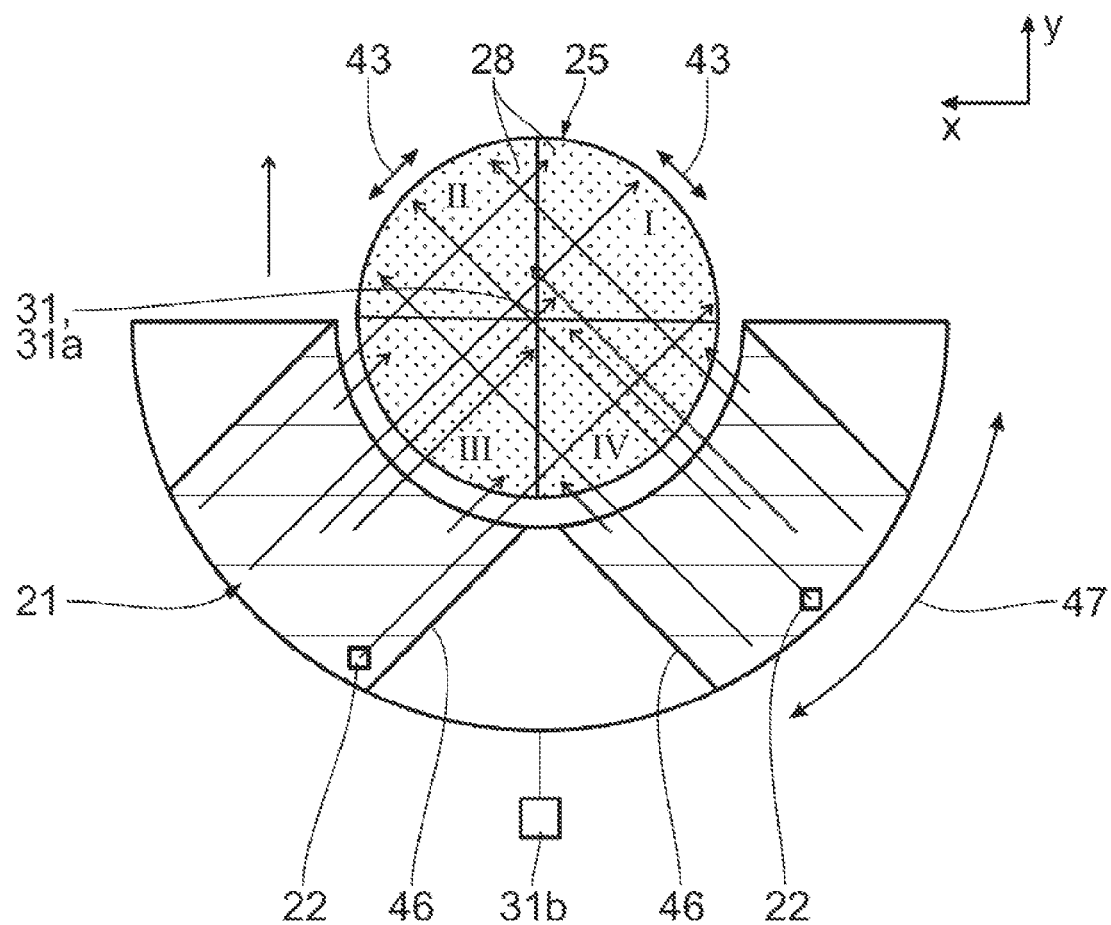

FIG. 8 shows, in an illustration similar to FIGS. 1 and 3, a further embodiment of an illumination optical unit of the projection exposure apparatus; and FIG. 9 shows, in an illustration similar to FIG. 4, a plan view of a pivotable embodiment of the pupil facet mirror and of the deflection facet mirror, embodied for realizing a quadrupole illumination with predefinable quadrupole orientation relative to a scanning direction of the projection exposure apparatus.

FIG. 1 shows a microlithographic projection exposure apparatus 1 highly schematically in a meridional section.

An illumination system 2 of the projection exposure apparatus 1 has, besides a radiation or light source 3, an illumination optical unit 4 for exposing an object field 5 in an object plane 6.

In order to simplify an explanation of positional relationships, in the drawing a Cartesian xyz-coordinate system is used hereinafter. An x-axis runs in FIG. 1 perpendicularly into the latter. A y-axis runs toward the right in FIG. 1. A z-axis runs perpendicularly to the xy-plane and downward in FIG. 1. The z-axis runs perpendicularly to the object plane 6.

A local Cartesian xyz-coordinate system is depicted in selected figures from among the figures below, wherein the x-axis runs parallel to the x-axis according to FIG. 1 and the y-axis spans with the x-axis the optical surface or the reflection surface of the respective optical element. The y-axis of the local xyz-coordinate system can be tilted with respect to the y-axis of the global Cartesian xyz-coordinate system according to FIG. 1.

The object field 5 can be designed in a rectangular or arcuate fashion with an x/y aspect ratio that is greater than 1 and is, for example, 13/1, 10/1 or 3/1. A reflective reticle 7 arranged in the object field 5 is exposed via the illumination optical unit 4, the reticle bearing a structure that is to be projected via the projection exposure apparatus 1 for producing micro- and/or nanostructured semiconductor components. The reticle 7 is carried by an object or reticle holder 8, which is displaceable in the y-direction in a manner driven via an object displacement drive 9. A projection optical unit 10, illustrated extremely schematically in FIG. 1, serves for imaging the object field 5 into an image field 11 in an image plane 12. The illumination optical unit 4 and the projection optical unit 10 form an optical system as the totality of the optical components of the projection exposure apparatus 1. The structure on the reticle 7 is imaged onto a light-sensitive layer of a wafer 13 arranged in the region of the image field 11 in the image plane 12. The wafer 13 is carried by a wafer holder 14, which is displaced in the y-direction in a manner driven with the aid of a wafer displacement drive 15 synchronously with the reticle holder 8 during projection exposure. In practice, the reticle 7 and the wafer 13 are actually significantly larger than the object field 5 and the image field 11.

During the operation of the projection exposure apparatus 1, the reticle 7 and the wafer 13 are scanned synchronously in the y-direction. Depending on the imaging scale of the projection optical unit 10, it is also possible for the reticle 7 to be scanned in an opposite direction relative to the wafer 13.

The radiation source 3 is an EUV radiation source having an emitted used radiation in the range of between 5 nm and 30 nm. This can be a plasma source, for example a GDPP (Gas Discharge Produced Plasma) source, or an LPP (Laser Produced Plasma) source. Other EUV radiation sources, for example those based on a Synchrotron or on a Free Electron Laser (FEL), are also possible.

An EUV radiation beam 16, which emerges from the radiation source 3 and is indicated by a dash-dotted chief ray in FIG. 1, is focused by a collector 17. A corresponding collector is known from EP 1 225 481 A, for example. The EUV radiation beam 16 is also designated hereinafter as used radiation, used light, illumination light or as imaging light.

Downstream of the collector 17, the EUV radiation beam 16 propagates through an intermediate focus 18 before impinging on a field facet mirror 19. A spectral filter can be arranged upstream of the field facet mirror 19, the spectral filter separating the used EUV radiation beam 16 from other wavelength components of the emission of the radiation source 3 that are not usable for the projection exposure. The spectral filter is not illustrated.

The field facet mirror 19 is arranged in a plane of the illumination optical unit 4 that is optically conjugate with respect to the object plane 6. The field facet mirror 19 has a multiplicity of field facets 20, only some of which are illustrated schematically in FIG. 1. The field facet mirror 19 can have hundreds of field facets 20. The field facets 20 of the field facet mirror 19 have an x/y aspect ratio corresponding approximately to the x/y aspect ratio of the object field 5. The field facets 20 therefore have an x/y aspect ratio that is greater than 1. A long facet side of the field facets 20 runs in the x-direction. A short facet side of the field facets 20 runs in the y-direction (scanning direction).

The field facet mirror 19 can be embodied as a microelectromechanical system (MEMS). It then has a multiplicity of field facet individual mirrors arranged in a matrix-like fashion in rows and columns in an array, which are not illustrated in greater detail in the drawing. One example of such an individual-mirror subdivision is given in US 2011/0001947A1. The facet individual mirrors can have square reflection surfaces, rectangular reflection surfaces or else reflection surfaces having different boundaries, for example in the form of rhombi or parallelograms. Boundary forms of the facet individual mirrors can correspond to those known from the theory of tiling. It is possible to use, in particular, a tiling which is known from US 2011/0001947 A1 and the references indicated therein.

The facet individual mirrors can have plane or curved, for example concave, reflection surfaces. The facet individual mirrors are in each case connected to actuators and designed to be tiltable about two axes perpendicular to one another in the reflection plane of the respective facet individual mirror. The actuators are signal-connected, in a manner that is not illustrated, to a central control device 24 (cf. FIG. 1), via which the actuators can be driven for the individual tilting of the facet individual mirrors.

Overall, the field facet mirror 19 has approximately 100 000 of the facet individual mirrors. Depending on the size of the facet individual mirrors, the field facet mirror 19 can also have for example 1000, 5000, 7000 or even hundreds of thousands of, for example 500 000, facet individual mirrors. The number of facet individual mirrors can alternatively also be significantly lower. The facet individual mirrors are combined in groups, wherein in each case one of the groups of facet individual mirrors forms one of the field facets 20. One example of such a group combination is likewise given in US 2011/0001947A1. The facet individual mirrors can have a highly reflective multilayer optimized for the respective angle of incidence and the wavelength of the EUV used light 16. As an alternative to a square shape, the field facet individual mirrors can also have reflection surfaces whose aspect ratio deviates from the value 1 for example by more than 50%. Such field facet individual mirrors having an aspect ratio that deviates from the value 1 can be arranged such that a projection of the field facet individual mirrors in the ray direction of the illumination light 16 has an aspect ratio in the region of the value 1.

The field facets 20 reflect partial beams of the illumination light 16 onto a deflection facet mirror 21.

Deflection facets 22 of the deflection facet mirror 21 in turn reflect partial beams of the illumination light 16 onto a pupil facet mirror 25.

Figure 2:
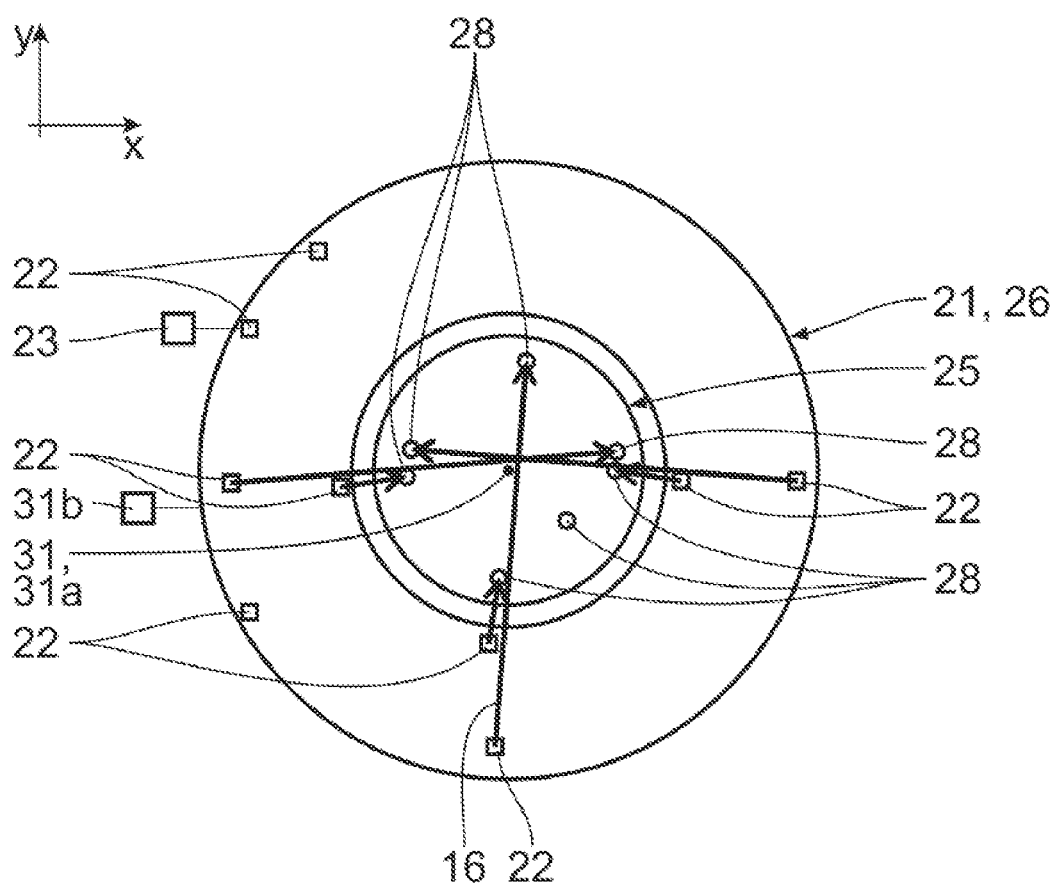

The deflection facets 22 are arranged on a deflection mirror carrier 26 arranged as a full ring around the pupil facet mirror 25. This is illustrated in FIG. 2. In FIG. 1, the deflection mirror carrier 26 is indicated in a dashed manner. A mirror carrier surface of the deflection facet mirror 21, the mirror carrier surface being predefined by the deflection mirror carrier 26, is inclined relative to a ring plane 27 of the deflection mirror carrier 26 and extends around the ring-shaped deflection mirror carrier 26 as a cone section. The deflection facets 22 are arranged on the deflection mirror carrier 26, the reflection surface of the deflection facets preferably being parallel to the local orientation of the mirror carrier surface of the deflection mirror carrier 26. A tilted orientation of the reflection surface of the deflection facets 22 with respect to the local orientation of the mirror carrier surface of the deflection mirror carrier 26 is also possible. An orientation of the reflection surfaces of the deflection facets 22 is tiltable in two axes with the aid of actuators 23.

The pupil facet mirror 25 lies in a region that is optically conjugate with respect to a pupil plane of the projection lens 10. The pupil facet mirror 25 is simultaneously arranged in the region of a plane into which the light source 3 or the intermediate focus 18 is imaged.

The pupil facet mirror 25 has a multiplicity of pupil facets 28, which are illustrated by way of example and schematically as circles in FIG. 2. Some partial beams of the illumination light 16 when impinging on the pupil facet mirror 25 via the deflection facet mirror 21 are illustrated by arrows in FIG. 2. In this case, in order to improve clarity, the deflection facet mirror 21 is illustrated such that its reflective side faces the observer, rather than its rear side, as evident per se from the view according to FIG. 1. Each of the deflection facets 22 guides the illumination light 16 reflected from a field facet 20 via exactly one pupil facet 28. By changing over the orientation of the deflection facets 22 with the aid of the actuators 23, it is possible for light of different field facets 20 alternatively also to be guided via one and the same pupil facet 28.

The field facets 20 of the field facet mirror 19 are imaged into the object field 5 by a transfer optical unit, which either is formed by the deflection facet mirror 21 and the pupil facet mirror 25 or to which further components between the field facet mirror 19 and in particular between the pupil facet mirror 25 and the object field 5 belong. Each of the field facets 20, if it is completely illuminated with the illumination light 16, can be imaged into the entire object field 5. The field facets 20, for their part, can be constructed from a plurality of individual mirrors. The pupil facets 28, for their part, can be constructed from a plurality of individual mirrors.

The field facets 20 of the field facet mirror 19, the deflection facets 22 and the pupil facets 28 of the pupil facet mirror 25 bear multilayer reflection coatings that are coordinated with the wavelength of the used light 16. The pupil facets 28 can be embodied in round, hexagonal or rectangular fashion and can be arranged according to the associated symmetries.

The pupil facet mirror 25 has more than 100 to thousands of pupil facets 28, for example 10 000 pupil facets 28. The number of field facets 20 of the field facet mirror 19 can be less than or equal to the number of pupil facets 28 of the pupil facet mirror 25. The number of deflection facets 22 corresponds to the number of pupil facets 28 and is, in particular, exactly equal thereto.

The field facets 20 and the pupil facets 28 are arranged in each case on a facet mirror carrier that is not illustrated in more specific detail. The facet mirror carrier of the facet mirror 19 is embodied in plane fashion in the exemplary embodiment. Alternatively, the facet mirror carrier can also be embodied in curved fashion, for example in spherically curved fashion. The facet mirror carrier of the pupil facet mirror 25 is embodied in concave fashion. In the case of the embodiment according to FIG. 1, the facet mirror carrier of the pupil facet mirror 25 has a cone envelope shape. A cone vertex 29 of the pupil facet mirror 25 faces away from the reflection surfaces of the pupil facets 28 and lies in the center 31 of the pupil facet mirror 25. The pupil facet mirror carrier therefore has the shape of a cone envelope section. In the embodiment according to FIG. 1, an opening angle of the cone is in the region of 120°. An azimuth angle of the cone is 360°.

With the aid of the field facets 20 and the deflection facets 22, the intermediate focus 18 is imaged in each case onto the pupil facets 28 illuminated with the beam 16 of rays. An image of the intermediate focus 18 arises on each of the illuminated pupil facets 28. This imaging need not be perfect.

Illumination channels are formed in each case by one of the field facets 20 or by a group of field facet individual mirrors forming the latter, by one of the deflection facets 22 and one of the pupil facets 28. Depending on how many of the individual mirrors of the field facet mirror 19 contribute to the respective illumination channel, the intermediate-focus image can arise as a superimposition of a plurality of intermediate-focus images which arise on account of the illumination light 16 being guided via a respective one of the field facet individual mirrors on the respective pupil facet 28. In this case, the intermediate-focus image need not arise exactly on the pupil facet 28 of the respective illumination channel. It suffices if the respective pupil facet 28 is situated in the region of the intermediate-focus image, such that the intermediate-focus image becomes situated, in particular, almost completely on the pupil facet 28. It may also suffice if, for example, 95% of the illumination light energy of an illumination channel is incident on the respective pupil facet 28, that is to say if a small part of the intermediate focus image does not become situated on the pupil facet 28.

With the aid of the deflection facets 22 and the pupil facets 28 and with the aid of a beam shaping mirror 29a disposed downstream of the pupil facet mirror 25 in the beam path of the beam 16 of rays, the field facets 20 are imaged onto the object field 5 in a manner being superimposed on one another.

A chief ray angle at the reticle 7 between a chief ray CR of the illumination light 16 and a normal to the object plane 6 is 6°, for example, and can be in the range of between 3° and 8°. A total aperture angle of the beam 16 of rays which illuminates the object field 5 is coordinated with the chief ray angle such that a reflective reticle 7 is imaged homogeneously onto the wafer. The beam 16 of rays reflected by the reticle 7 (cf. FIG. 1) lies completely outside the beam 16 of rays incident on the reticle 7.

Depending on whether the field facets 20, the deflection facets 22 or the pupil facets 28 are a constituent part of an imaging transfer optical unit, the field facets 20 and/or the deflection facets 22 and/or the pupil facets 28 either have an imaging effect, that is to say are designed in particular in concave or convex fashion, or are embodied as pure deflection or plane mirrors or plane facets. The field facets 20 and/or the deflection facets 22 and/or the pupil facets 28 can bear correction aspheres for the correction of imaging aberrations of the illumination optical unit 4.

The deflection facet mirror 21 is arranged such that angles $\alpha$ of incidence of illumination light beam paths of the partial beams or partial rays of the illumination light 16 along illumination channels formed in each case by one of the field facets 20, one of the deflection facets 22 and one of the pupil facets 28, which are aligned for guiding the respective illumination light partial ray, deviate by a maximum of 20°, alternatively by a maximum of 15°, by a maximum of 10°, by a maximum of 5° or by a maximum of 3°, from a Brewster angle of the multilayer reflection coating on the respective pupil facet 28. The pupil facets 28 therefore serve as polarization elements which have the effect that the illumination light 16 is s-polarized after the reflection at the pupil facets 28 with respect to the plane of incidence of the respective illumination light partial beam on the pupil facet 28. This s-polarization is indicated by dots 30 on partial rays of the illumination light 16 in FIG. 1. The rays of the illumination light 16 which run in the plane of the drawing in FIG. 1 are therefore polarized perpendicularly to the plane of the drawing after reflection at the pupil facets 28.

In other embodiments of the arrangement of the deflection facet mirror 21 with respect to the pupil facet mirror 25, a deviation of the angles $\alpha$ of incidence with respect to the Brewster angle of incidence can also be greater than 3.3°. The deviation of the angle $\alpha$ of incidence from the Brewster angle can be a maximum of 25°, can be a maximum of 20°, can be a maximum of 15°, can be a maximum of 10°, can be a maximum of 5°, or can, as in the exemplary embodiment above, be even smaller.

The number of field facets 20 of the field facet mirror 19 is at most equal to the number of deflection facets 22. In the case of the embodiment according to FIG. 1, the number of deflection facets 22 is in turn much greater than the number of field facets 20 and can be, in particular, ten times as great or even greater still.

The configuration of the illumination optical unit 4 is such that the field facets 20 are not imaged onto the deflection facets 22 nor are the deflection facets 22 imaged onto the pupil facets 28 nor are the field facets 20 imaged onto the pupil facets 28. The number of deflection facets 22 is exactly equal to the number of pupil facets 28.

The field facets 20 and the pupil facets 28 are arranged in such a way that the illumination channels, each formed by exactly one of the field facets 20, by exactly one of the deflection facets 22 and exactly one of the pupil facets 28, which facets in each case are aligned for guiding a partial ray of the illumination light 16, are in each case fixedly assigned to a mirror pair 22, 28 to which the deflection facets 22 and the pupil facet 28 belong. The field facet individual mirrors of the field facet mirror 19, via their associated actuators, are freely switchable between different tilting positions, such that the illumination light 16 is directed onto one of a plurality of deflection facets 22 depending on the tilting position of the field facet individual mirror. As already explained above, the deflection facets 22 are fixedly assigned to the respective pupil facets 28. An illumination beam path is therefore fixedly predefined in the illumination optical unit 4 as far as the field facet mirror 19 and proceeding from the deflection facet mirror 21. A variation of the illumination is brought about exclusively via a tilting of the field facets 20 or of the field facet individual mirrors of the field facet mirror 19, wherein the tilting positions are used to select which of the pupil facets 28 are impinged on with the illumination light 16 in sections, if appropriate.

In one variant of the illumination optical unit 4, the deflection facet mirror 21, on the one hand, and the pupil facet mirror 25, on the other hand, are pivotable about a common pivoting axis 31a running through the center 31 of the pupil facet mirror 25 and along an optical axis of the illumination light 16 between the pupil facet mirror 25 and the object field 5. The deflection facet mirror 21 and the pupil facet mirror 25 are rotatable about the pivoting axis 31a for example by pivoting angles in the range of +/−45°. This pivoting can be effected in a manner controlled jointly or else independently of one another. For the purpose of pivoting, the deflection facet mirror 21 and the pupil facet mirror 25 are operatively connected either to a common pivoting drive or in each case to a dedicated pivoting drive, which is indicated extremely schematically at 31b in FIG. 1. The pivoting drive 31b can be a stepper motor.

Furthermore, in this variant of the configuration of the illumination optical unit 4, the field facet mirror 19 is pivotable about a pivoting axis 31c that runs through the center of a field facet mirror carrier and is perpendicular to a principal plane of reflection of the field facet mirror 19. A pivotability of the field facet mirror 19 about the pivoting axis 31c can be in the range of +/−90°. For the purpose of pivoting, the field facet mirror is operatively connected to a pivoting drive 31d, which is likewise indicated highly schematically in FIG. 1. The pivoting drive 31d, too, can be a stepper motor.

The pivoting drives 31b and 31d are signal-connected to the central control device 24.

During pivoting, the pivoting drives 31b, 31d can be driven such that the field facet mirror 19 is pivoted by double the absolute value of a pivoting angle compared with the joint pivoting of the deflection facet mirror 21 and the pupil facet mirror 25.

The embodiment of the illumination optical unit 4 with overall pivotable facet mirrors 19, 21, 25 is used, for example, if e.g. exactly one linear polarization direction or exactly two linear polarization directions are to be predefined for illuminating the object field 5, wherein the orientation of this linear polarization direction is predefined depending on the respective pivoting angle about the pivoting axes 31a and 31c. If, for example, exactly one linear polarization direction is to be predefined for the illumination of the object field 5, or if exactly two linear polarization directions perpendicular to one another in the object plane 6 are to be predefined for illuminating the object field 5, this results in an illumination geometry in which the field facets 20 of the field facet mirror 19 can be closely packed.

In the variant with the pivotable deflection facet mirror 21 and the pivotable pupil facet mirror 25, in the case where the field facet mirror 19 has field facets 20 constructed from micromirrors, a pivotability of the field facet mirror 19 can also be dispensed with. The field facets 20 could then be oriented according to the respective pivoting position of the deflection facet mirror 21 and of the pupil facet mirror 25 via a group assignment of the micromirrors adapted thereto.

A further embodiment of an illumination optical unit 32, which can be used instead of the illumination optical unit 4 in the projection exposure apparatus 1, is described below with reference to FIGS. 3 to 7. Components and functions corresponding to those which have already been explained above with reference to FIGS. 1 and 2 bear the same reference numerals and will not be discussed in detail again. FIG. 3 shows the beam path of the illumination light 16 between the intermediate focus 18 and the object field 5.

In the case of the illumination optical unit 32, the deflection facet mirror 21 is arranged on a deflection mirror carrier 33 (also cf. FIG. 4), which is arranged in the shape of a partial ring in the form of a half-ring spatially around the pupil facet mirror 25. The deflection mirror carrier 33 extends around the center 31 of the pupil facet mirror 25 by approximately 180°. In this case, the center 31 of the pupil facet mirror 25 is defined as the center of a circumferential contour of the pupil facet mirror carrier, projected onto the pupil plane 34 of the illumination optical unit 32. The pupil plane 34 is illustrated in perspective view in FIG. 6 and runs parallel to the plane of the drawing in FIG. 4 and perpendicularly to the plane of the drawing in FIG. 3.

The half-ring configuration of the deflection mirror carrier 33 of the deflection facet mirror 21 opens up structural space 35 for an imaging beam path of the projection optical unit 10 on the opposite side of the pupil facet mirror 25 relative to the deflection mirror carrier 33. The structural space 35 is illustrated by dashed lines by way of example in FIG. 4.

Figure 5:
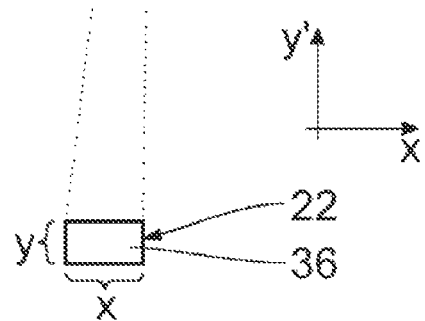
FIG. 5 shows a plan view of a reflection surface of a deflection facet of the deflection facet mirror according to FIG. 4.

FIG. 5 shows one of the deflection facets 22 in an enlarged excerpt. The deflection facet 22 has a reflection surface 36 whose x/y has approximately the value √2. The x/y aspect ratio of the deflection facets 22 therefore deviates from the value 1 by more than 30%.

The reflection surface 36 of the deflection facet 22 is illustrated as rectangular by way of example in FIG. 5. A different boundary shape of the reflection surface 36, as already explained above, is also possible.

Figure 6:
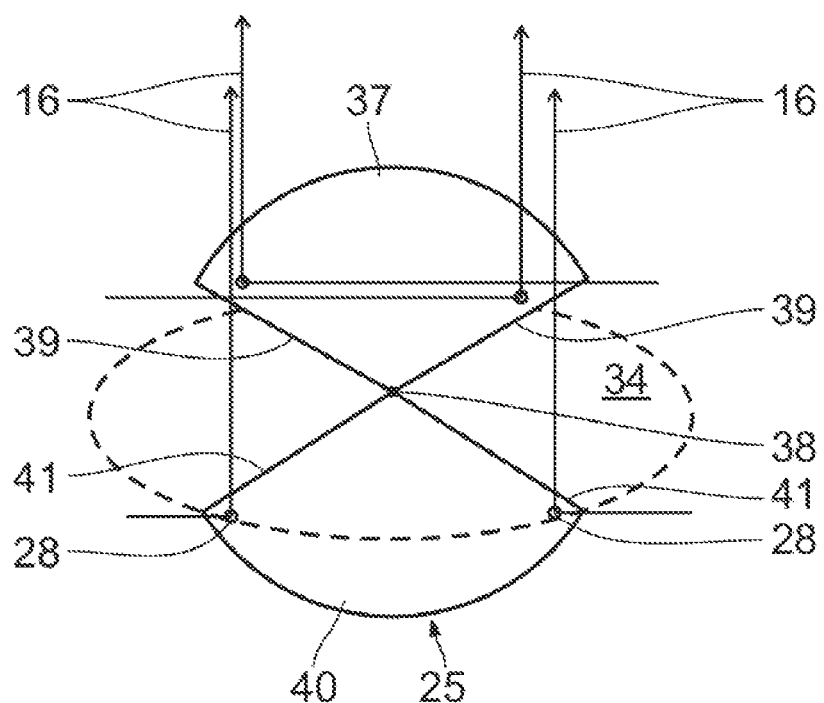
FIG. 6 shows a perspective view of the pupil facet mirror of the embodiment according to FIGS. 4 and 5, as seen from viewing direction VI in FIG. 3.
Figure 7:
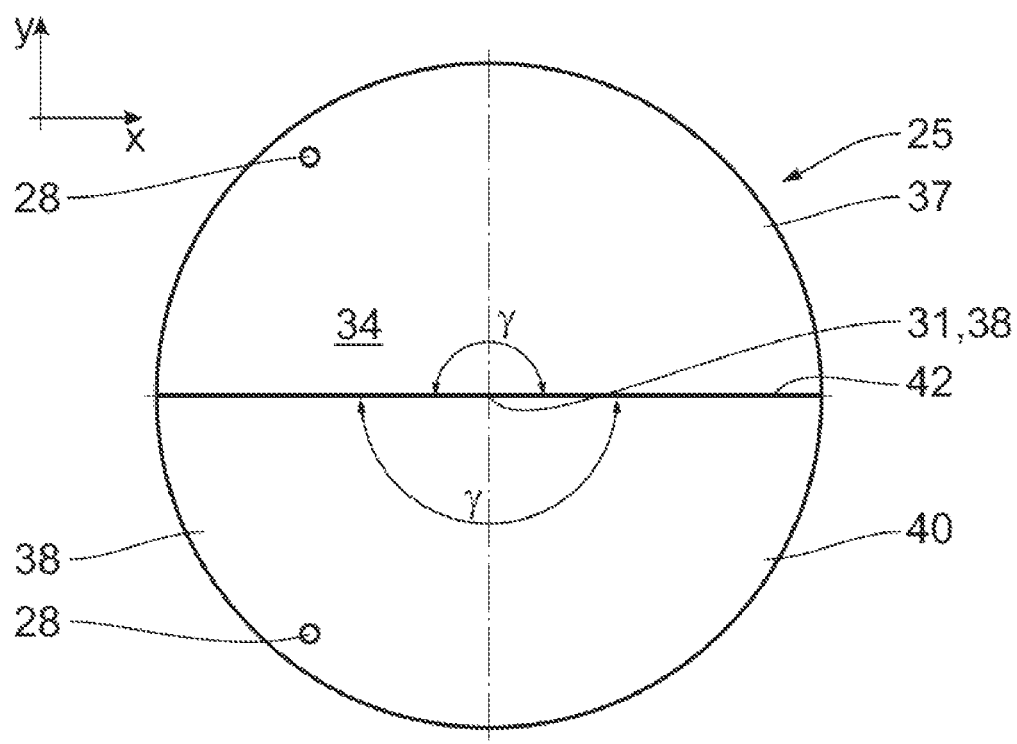
FIG. 7 shows the pupil facet mirror according to FIGS. 3, 4 and 6 in an enlarged illustration relative to FIG. 4.

A pupil facet mirror carrier of the pupil facet mirror 25 of the embodiment according to FIGS. 3 and 4 has the shape of a double cone envelope section and is illustrated in perspective view in FIG. 6.

A first cone envelope section 37 lies between the pupil plane 34 and the object plane 6. A mirror carrier surface of the first cone envelope section 37 forms a concave half-cone whose cone vertex 38, which simultaneously constitutes the vertex of the double cone, lies in the pupil plane 34. A half opening angle β of the cone of which the cone envelope section 37 forms a section is approximately 45°. An azimuth angle γ of the cone envelope section 37 is approximately 180°. The azimuth angle γ lies between end edges 39 of the cone envelope section 37. The end edges 39 run along straight envelope lines of the cone envelope section 37.

The double cone section shape of the pupil facet mirror 25 of the illumination optical unit 32 is supplemented by a further cone envelope section 40, the cone vertex 38 of which coincides with the cone vertex 38 of the cone envelope section 37 described above. End edges 41 of the second cone envelope section 40 constitute extensions of the end edges 39 of the first cone envelope section 37 through the cone vertex 38. The end edges 39 and 41 delimit a separating joint 42 between the cone envelope sections 37, 40, as seen in projection onto the pupil plane 34 (cf. FIG. 7).

A mirror carrier surface of the second cone envelope section 40 is convexly curved. The half opening angle β of the second cone envelope section 40 is exactly equal to the opening angle β of the first cone envelope section 37 (cf. FIG. 3). The cone envelope section 40 also sweeps an azimuth angle γ of approximately 180°.

The double cone arrangement of the two cone envelope sections 37, 40 and the associated arrangement of the semicircular deflection facet mirror 21 is such that, considered from every circumferential angle of the deflection facet mirror 21, the pupil facet mirror 25 forms a straight line inclined at the same angle δ with respect to the pupil plane 34. To put it another way, for every plane of the drawing analogously to FIG. 3 through an optical axis (CR in FIG. 3) between the deflection facet mirror 21 and the reticle 7, a sectional figure with this deflection facet mirror 21 and the pupil facet mirror 25 is a straight line.

In so far as the illumination light 16, as illustrated by way of example in FIGS. 2 and 4, in the projection onto the pupil plane 34 from the deflection facets 22, is directed onto the pupil facets 28 to a good approximation radially with respect to the center 31 of the pupil facet mirror 25, all partial beams of the illumination light 16 are deflected at the pupil facets 28 with the same angle of incidence. The angle of incidence is in turn around the Brewster angle of incidence of approximately 43° with a deviation of a maximum of 20°, alternatively of a maximum of 15°, of a maximum of 10°, of a maximum of 5° or of a maximum of 3°, such that the pupil facets 28 of the pupil facet mirror 25 act as polarizers for the correspondingly deflected illumination light 16. Depending on the location of the deflection facet mirror 21 from which the light is directed onto the pupil facet mirror 25, a correspondingly linearly polarized partial beam of the illumination light results. It is also possible to direct all partial beams of the illumination light 16 from the deflection facets 22 onto the pupil facets 28 such that they run exactly radially with respect to the center 31 of the pupil facet mirror 25, that is to say all run through the center 31 in the projection according to FIGS. 2 and 4.

The resulting polarization directions run tangentially with respect to the semicircle shape of the deflection facet mirror 21 in the projection onto the pupil plane 34, as indicated by polarization arrows 43 in FIG. 4. Since all linear polarization directions can thus be produced, it is possible to produce an illumination pupil with tangential polarization, as indicated by the corresponding polarization arrows 43 on the pupil facet mirror 25 in FIG. 4.

In the embodiment of the illumination optical unit 32 according to FIG. 3, the pupil facet mirror 25 constitutes a last illumination-light-guiding component of the illumination optical unit 32 upstream of the object field 5.

In a variant of the embodiment according to FIGS. 3 to 7, the deflection facet mirror 21 and the pupil facet mirror 25 and also, if appropriate, the field facet mirror 19 are once again pivotable about pivoting axes (cf. pivoting axis 31a in FIG. 4) with the aid of pivoting drives (cf. the schematically indicated pivoting drive 31b in FIG. 4), as has already been explained above in connection with FIGS. 1 and 2.

A further embodiment of an illumination optical unit 44, which can be used instead of the illumination optical units 4 and respectively 32 in the projection exposure apparatus 1, is described below with reference to FIG. 8. Components and functions corresponding to those which have already been explained above with reference to FIGS. 1 to 7 bear the same reference numerals and will not be discussed in detail again.

The illumination optical unit 44 has a deflection facet mirror 21 and a double-cone-shaped pupil facet mirror 25 of the type of those which have already been explained above with reference to the embodiment according to FIGS. 3 to 6. In contrast to the illumination optical unit 32, the double cone pupil facet mirror 25 of the illumination optical unit 44 does not direct the illumination light 16 directly to the object or illumination field 5, but rather approximately in the opposite direction to the deflection direction of the pupil facet mirror 25 of the illumination optical unit 32 toward a beam shaping mirror 45. The beam shaping mirror 45 has the effect that an exit pupil of the illumination optical unit 44 lies in the illumination beam path more than 5 m upstream of the object field 5. Alternatively, it is possible to achieve a position of the exit pupil of the illumination optical unit 44 at infinity, that is to say a telecentricity of the illumination optical unit, or a position of the exit pupil in the illumination beam path downstream of the object field 5, that is to say in the imaging beam path of the downstream projection optical unit.

A plurality or else a multiplicity of the deflection facets 22 can be assigned to each of the field facets 20. In this way it is possible, via correspondingly grouped micromirrors of the field facet mirror 19, to distribute an illumination light partial beam coming from one of the field facets 20 to be imaged into the object field 5 among a plurality of the pupil facets 28. Facet section images of field facet sections therefore represent strips in the object field 5 which extend transversely with respect to the object displacement direction y over an entire object field height, that is to say over the entire x-extent, of the object field 5.

Correspondingly, the image of one of the field facets 20 in the object field 5 can be constructed for example line by line with lines offset in the y-direction over different pupil facets from among the pupil facets 28. Via a corresponding tilting angle assignment of the micromirrors of a field facet 20, strip sections of the object field 5 which extend in the x-direction over the entire object field 5 can thus be illuminated from different illumination directions according to the position of the pupil facet 28 involved in this illumination. This is illustrated in an insert in FIG. 1, which shows a plan view of the, for example rectangular, object field 5. The illustration shows a total of four of such object field strips 5a to 5d, which are separated from one another schematically by dashed lines. These object field strips 5a to 5d are images of facet sections of the field facets 20. An object field height, that is to say an entire extent of the object field 5 in the x-direction, is designated as 5x in this insert. A reticle point scanned through the object field 5 along the y-direction then sees the illumination light from the different illumination directions in a scan-integrated manner.

In a variant of the embodiment according to FIG. 8, the deflection facet mirror 21, the pupil facet mirror 25 and, if appropriate, the field facet mirror 19 can be pivotable for predefining a polarization orientation and/or pivotable for predefining an orientation of an imaging of the field facets 20 onto the object field 5. For this purpose, the facet mirrors 21, 25 and, if appropriate, 19 can interact with pivoting drives, which is not illustrated in detail in FIG. 8.

FIG. 9 shows, in an illustration similar to FIGS. 2 and 4, an embodiment of the deflection facet mirror 21 and of the pupil facet mirror 25 for generating a quadrupole illumination of the object field 5. During the quadrupole illumination, each object field point is illuminated by four illumination poles arranged respectively in a quadrant of the illumination pupil. The linear polarization 43 of the illumination light 16 has, for each of the quadrants, a direction of polarization that is perpendicular to a connecting line from a center of the respective quadrant to the center of the illumination pupil.

In FIG. 9, the four quadrants in which the pupil facet mirror 25 is illuminated for the quadrupole illumination are numbered consecutively by I, II, III and IV in the mathematically customary direction. A linear polarization direction 43 parallel to the xy-angle bi-sector is present in quadrants I and III of the pupil facet mirror 25. The linear polarization 43 in the other two quadrants II and IV runs exactly perpendicularly to the xy-angle bi-sector.

Deflection facets 22 of the deflection facet mirror 21 in deflection facet regions 46 contribute to the corresponding illumination of the pupil facet mirror 25, the deflection facet regions being illustrated in a hatched manner on the deflection facet mirror 21 in FIG. 9.

As already explained above in connection with FIG. 2, the two facet mirrors 21, 25 can be configured as pivotable about the pivoting axis 31a. As a result, the polarization direction of the quadrupole illumination and the orientation of the poles of the quadrupole illumination can be adapted to a predefined value. A pivoting movement performed by the deflection facet mirror 21 jointly with the pupil facet mirror 25 is indicated by a double-headed arrow 47 in FIG. 9. Pivoting about the pivoting axis 31a in the range of between +/−45° can be predefined by the common pivoting drive 31b for the deflection facet mirror 21 and the pupil facet mirror 25. The field facets 20 of the associated field facet mirror 19 can then be oriented either by the pivoting of the field facet mirror 19 overall or, in the case of a micromirror configuration of the field facets 20, by a change in the assignment of groups of micromirrors to adapted field facets.

During projection exposure, the reticle 7 and the wafer 13 bearing a coating that is light-sensitive to the EUV radiation beam 16 are provided. Prior to exposure, an illumination setting is set, that is to say for example a dipole setting or an annular setting or else a different setting, for example a conventional illumination setting or a multipole illumination setting. Afterward, at least one section of the reticle 7 is projected onto the wafer 13 with the aid of the projection exposure apparatus 1. Finally, the light-sensitive layer exposed by the EUV radiation beam 16 on the wafer 13 is developed. The micro- and/or nanostructured component, for example a semiconductor component, for example a memory chip, is produced in this way.

The invention claimed is:

1. An illumination optical unit configured to illuminate an object field, the illumination optical unit comprising:
    a field facet mirror comprising a plurality of field facets; and
    a transfer optical unit, comprising:
        a pupil facet mirror comprising a plurality of pupil facets; and
        a deflection facet mirror comprising a plurality of deflection facets,
    wherein:
        the illumination optical unit is a projection lithography illumination optical unit;
        the deflection facet mirror is between the field facet mirror and the pupil facet mirror along an illumination beam path;
        the illumination optical unit is configured so that, during use of the illumination optical unit:
            the field facets are imaged into the object field via the transfer optical unit;
            the deflection facet mirror is not imaged onto the pupil facets;
            light passing along the illumination beam path comprises a plurality of illumination channels;
            each illumination channel guides a partial beam of the light;
            each illumination channel is defined by a corresponding field facet, a corresponding deflection facet, and a corresponding pupil facet; and
            for each illumination channel, an angle of incidence of the illumination channel deviates by a maximum of 25° from a Brewster angle of a multilayer reflection coating of the corresponding pupil facet.

2. The illumination optical unit of claim 1, wherein the deflection facets are supported by a deflection facet mirror carrier, and the deflection facet mirror carrier is arranged in the shape of at least a partial ring spatially around the pupil facet mirror.

3. The illumination optical unit of claim 2, wherein the deflection facet mirror carrier extends by not more than 200° in a circumferential direction around a center of the pupil facet mirror.

4. The illumination optical unit of claim 1, wherein each deflection facet comprises a reflection surface having an aspect ratio that deviates from one by more than 30%.

5. The illumination optical unit of claim 1, wherein the pupil facet mirror is supported by a pupil facet mirror carrier having sections with the shape of a cone envelope.

6. The illumination optical unit of claim 1, wherein the pupil facet mirror is supported by a pupil facet mirror carrier having the shape of a double cone envelope section.

7. The illumination optical unit of claim 1, wherein the transfer optical unit further comprises a beam shaping mirror in the illumination beam path between the pupil facet mirror and the object field.

8. The illumination optical unit of claim 1, wherein each deflection facet comprises a reflection surface having an aspect ratio that deviates from one by more than 30%.

9. The illumination optical unit of claim 1, wherein the pupil facet mirror is supported by a pupil facet mirror carrier having sections with the shape of a cone envelope.

10. The illumination optical unit of claim 1, wherein the pupil facet mirror is supported by a pupil facet mirror carrier having the shape of a double cone envelope section.

11. The illumination optical unit of claim 1, further comprising a beam shaping mirror in the illumination beam path between the pupil facet mirror and the object field.

12. An optical system, comprising:
an illumination optical unit according to claim 1; and
a projection optical unit configured to image an object in the object field into an image field.

13. An illumination system, comprising:
an EUV light source; and
an illumination optical unit according to claim 1.

14. An apparatus, comprising:
an EUV light source;
an illumination optical unit according to claim 1; and
a projection optical unit configured to image an object in the object field into an image field,
wherein the apparatus is a projection exposure apparatus.

15. The apparatus of claim 14 further comprising:
a first holder configured to hold an object in the object field;
a first displacement drive configured to displace the object holder in an object displacement direction;
a second holder configured to hold a wafer in the image field; and
a second displacement drive configured to displace the wafer.

16. The apparatus of claim 15, wherein the illumination optical unit is configured so that, during use of the apparatus, facet section images of field facet sections represent strips in the object field which extend transversely with respect to the object displacement direction over an entire object field height of the object field.

17. A method of using a projection exposure apparatus comprising an illumination unit and a projection optical unit, the method comprising:
using the illumination optical unit to at least partially illuminate an object in an object plane; and
using the projection optical unit to image at least a portion of the illuminated object into an image plane,
wherein the illumination optical unit comprises an illumination optical unit according to claim 1.

18. An illumination optical unit configured to illuminate an object field, the illumination optical unit comprising:
a field facet mirror comprising a plurality of field facets; and
a transfer optical unit, comprising:
a pupil facet mirror comprising a plurality of pupil facets; and
a deflection facet mirror comprising a plurality of deflection facets,
wherein:
the illumination optical unit is a projection lithography illumination optical unit;
the deflection facet mirror is between the field facet mirror and the pupil facet mirror along an illumination beam path;
the illumination optical unit is configured so that, during use of the illumination optical unit:
the field facets are imaged into the object field via the transfer optical unit;
the deflection facet mirror is not imaged onto the pupil facets;
the deflection facets are supported by a deflection facet mirror carrier; and
the deflection facet mirror carrier is arranged in the shape of at least a partial ring spatially around the pupil facet mirror.

19. The illumination optical unit of claim 18, wherein the deflection facet mirror carrier extends by not more than 200° in a circumferential direction around a center of the pupil facet mirror.

20. An illumination optical unit configured to illuminate an object field, the illumination optical unit comprising:
a field facet mirror comprising a plurality of field facets; and
a transfer optical unit, comprising:
a pupil facet mirror comprising a plurality of pupil facets; and
a deflection facet mirror comprising a plurality of deflection facets,
wherein:
the illumination optical unit is a projection lithography illumination optical unit;
the deflection facet mirror is between the field facet mirror and the pupil facet mirror along an illumination beam path;
the illumination optical unit is configured so that, during use of the illumination optical unit:
the field facets are imaged into the object field via the transfer optical unit;
the deflection facet mirror is not imaged onto the pupil facets; and
at least one of the following holds:
the pupil facet mirror is supported by a pupil facet mirror carrier having sections with the shape of a cone envelope; or
the pupil facet mirror is supported by a pupil facet mirror carrier having the shape of a double cone envelope section.

21. The illumination optical unit of claim 20, wherein the pupil facet mirror is supported by a pupil facet mirror carrier having sections with the shape of a cone envelope.

22. The illumination optical unit of claim 20, wherein the pupil facet mirror is supported by a pupil facet mirror carrier having the shape of a double cone envelope section.

* * * * *

UNITED STATES PATENT AND TRADEMARK OFFICE
CERTIFICATE OF CORRECTION

| | |
|---|---|
| PATENT NO. | : 9,746,779 B2 |
| APPLICATION NO. | : 14/823120 |
| DATED | : August 29, 2017 |
| INVENTOR(S) | : Manfred Maul |

It is certified that error appears in the above-identified patent and that said Letters Patent is hereby corrected as shown below:

On the Title Page

Page 2, Line 2, under "OTHER PUBLICATIONS", delete "2103." and insert -- 2013. --.

In the Specification

Column 1, Line 65, delete "micro-mirrors" and insert -- micromirrors --.

Column 2, Line 34, delete "down-stream" and insert -- downstream --.

Column 5, Line 28, delete "a such" and insert -- such a --.

Column 15, Line 31, delete "bi-sector" and insert -- bisector --.

Column 15, Line 34, delete "bi-sector." and insert -- bisector. --.

Signed and Sealed this
Nineteenth Day of December, 2017

Joseph Matal
*Performing the Functions and Duties of the
Under Secretary of Commerce for Intellectual Property and
Director of the United States Patent and Trademark Office*